(12) United States Patent
Igarashi

(10) Patent No.: US 8,634,443 B2
(45) Date of Patent: Jan. 21, 2014

(54) LASER DIODE AND METHOD OF MANUFACTURING THE SAME

(75) Inventor: Toshiaki Igarashi, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 231 days.

(21) Appl. No.: 12/591,782

(22) Filed: Dec. 1, 2009

(65) Prior Publication Data

US 2010/0085998 A1  Apr. 8, 2010

(30) Foreign Application Priority Data

Dec. 5, 2008 (JP) .................. 2008-310670

(51) Int. Cl.
*H01S 5/00* (2006.01)
(52) U.S. Cl.
USPC ..................................... 372/45.01
(58) Field of Classification Search
None
See application file for complete search history.

(56) References Cited

U.S. PATENT DOCUMENTS

| | | | | |
|---|---|---|---|---|
| 5,084,892 A | * | 1/1992 | Hayakawa | ............... 372/45.01 |
| 6,031,243 A | * | 2/2000 | Taylor | ................. 372/46.01 |
| 6,167,070 A | * | 12/2000 | Sakata | ................ 372/45.01 |
| 7,583,716 B2 | | 9/2009 | Matsumura et al. | |
| 2006/0078024 A1 | * | 4/2006 | Matsumura et al. | ........ 372/46.01 |

FOREIGN PATENT DOCUMENTS

| | | |
|---|---|---|
| JP | 2002-324947 | 11/2002 |
| JP | 2005-311308 | 11/2005 |
| JP | 2006-165407 | 6/2006 |

* cited by examiner

*Primary Examiner* — Armando Rodriguez
*Assistant Examiner* — Sean Hagan
(74) *Attorney, Agent, or Firm* — McGinn Intellectual Property Law Group, PLLC

(57) ABSTRACT

A laser diode has a plurality of structures, each of which having a function of scattering, absorbing or reflecting stray light, disposed in a region along an optical waveguide, wherein at least one of said structures is formed in each divided region obtained by equally dividing said region along said optical waveguide into three or more parts in the longitudinal direction of said optical waveguide.

21 Claims, 13 Drawing Sheets

θ h (deg)
NO RIPPLES

WITH RIPPLES

LASER DIODE AND METHOD OF MANUFACTURING THE SAME

This application is based on Japanese patent application No. 2008-310670 the content of which is incorporated hereinto by reference.

BACKGROUND

1. Technical Field

The present invention relates to a laser diode and a method of manufacturing the same.

2. Related Art

It has been known that laser diodes making use of Group-III nitride semiconductor materials are less likely to give a good Gaussian profile of far-field pattern. More specifically, typically as illustrated in FIG. 13, the profile of the far-field pattern occasionally contains ripples or deformation of overall shape. For reference, FIG. 12 comparatively illustrates a good Gaussian profile of the far-field pattern without ripples.

One possible reason why the irregularity occurs in the profile of the far-field pattern as illustrated in FIG. 13 resides in that the gallium nitride (GaN) or sapphire, which is used as a material for composing the substrate, is transparent to the light at a wavelength of oscillation of the semiconductor laser (405 nm for Blu-Ray Disk applications).

In general, an optical waveguide of the laser diode does not show completely 100% optical confinement, but allows leakage of light from the optical waveguide little by little. In other words, stray light produces. It is also general that the optical waveguide is not spatially uniform, but contains fluctuations in the geometry, composition of the material, crystallinity and so forth. Also the spatial fluctuation is causative of the leakage of light.

Thus-produced stray light randomly propagates through the element, irrespective of the mode of the optical waveguide. In general, the stray light may be absorbed by the substrate material, if the substrate is based on a material system other than Group-III nitride semiconductors. In this case, the stray light may be absorbed mainly by the substrate material, and thereby the stray light may immediately be attenuated, without severely affecting operations of the element. On the other hand, for the case of using the Group-III nitride semiconductors, GaN and sapphire used for composing the substrate are transparent to the light at the wavelength of oscillation. The stray light is, therefore, less likely to be attenuated through absorption by the substrate. In particular for the case of using a GaN substrate, the refractive index of the GaN substrate is often larger than the effective refractive index characterizing the waveguide mode, so that generation of the stray light and propagation thereof in the GaN substrate may be more likely to be promoted. A part of the stray light is emitted from the output end of the laser diode, at a small intensity. The stray light therefore interferes with the intrinsic laser light, and consequently disturbs the far-field pattern as illustrated in FIG. 13.

There have already been proposed several methods of improving the disturbance in the far-field pattern. Japanese Laid-Open Patent Publication No. 2005-311308 discloses a system of providing trenches on both sides of an optical waveguide, in the vicinity of the output end of the laser diode. This publication further mentions a method of providing trenches on both sides of the optical waveguide also in the vicinity of the reflective end. An effect of the trenches described in this publication is to reflect or scatter the stray light possibly emitted from around a emission spot towards the outside of the laser diode. Components of the stray light most likely to interfere with the intrinsic output light of the laser element are those emitted from around the emission spot in the nearly same direction with the intrinsic output light of laser element. It may therefore be said that this technique improves the far-field pattern, by efficiently reflecting or scattering the components of the stray light most causative of disturbance in the far-field pattern.

Other documents of the prior art relevant to the present invention include Japanese Laid-Open Patent Publication Nos. 2002-324947 and 2006-165407.

Japanese Laid-Open Patent Publication 2002-324947 discloses a laser diode having a recess in the vicinity of the output end, wherein the recess is located so as to be brought into contact with, or located in proximity to a ridge portion. Also in this case, the profile of the far-field pattern is improved by the recess.

Also in Japanese Laid-Open Patent Publication No. 2006-165407, it is described that the ripples in the far-field pattern may be suppressed by similarly providing a plurality of recesses on the oscillation surface on the light output side.

However, the techniques disclosed in each of Japanese Laid-Open Patent Publication Nos. 2005-311308, 2002-324947 and 2006-165407 respectively have problems to be solved as explained below.

The structure disclosed in Japanese Laid-Open Patent Publication No. 2005-311308 tends to make the process margin in the manufacturing more stringent. In particular, it is difficult to ensure a sufficient process margin as for the distance between each of the trenches and the optical waveguide, and the distance between each of the trenches and the end face of the element (site of cleavage).

The distance between each of the trenches and the optical waveguide will be explained first. If the trenches and the optical waveguide are too close to each other, the optical waveguide may be damaged in the process of forming the trenches by dry etching, and the element characteristics may consequently be degraded. Not only the stray light, but also the light output of the laser diode per se may partially be scattered by the trenches. If a part of the waveguide mode is disturbed by scattering, degradation in the far-field pattern may be anticipated, raising an effect against expectations. On the other hand, if the trenches and the optical waveguide are placed too far, the effect of scattering of the stray light may be weaker. It is therefore necessary to design the laser element while taking not only the optimum distance between the each of the trenches and the optical waveguide, but also process accuracy and reproducibility into consideration. In particular, mask alignment in the individual processes needs a high level of preciseness.

Next, the distance between each of the trenches and the end face of the element will be discussed. Too small distance may make cleavage of the wafer difficult. In the process of manufacturing the laser diode, the wafer may necessarily be cleaved into bars, except for special cases such as manufacturing those having surface emission structures. The Group-III nitride semiconductors are, however, difficult to be straightly cleaved as compared with other compound semiconductor materials, and are therefore difficult to yield flat cleavage surface. If the structures such as trenches reside in the close vicinity of the site of cleavage, the cleavage surface may incline towards the trenches. If the laser light is output from the inclined cleavage surface, the laser light is distorted, raising another cause for degradation in the far-field pattern. In addition, the effect of scattering the stray light by the trenches may degrade.

In view of solving these problems, Japanese Laid-Open Patent Publication No. 2005-311308 mentions also a system having the trenches disposed so as to overlap the surface of the oscillator, to thereby allow the trenches also to assist the cleavage (a system of providing cleavage-assisting trenches). However, the provision of the trenches so as to overlap the surface of oscillation allows scattering of light only once on the side faces of the trenches, only to give a limited effect of scattering. It may therefore be necessary to additionally provide trenches for scattering, besides the cleavage-assisting trenches, away from the surface of oscillation. In this case, the cleavage may occur in an inclined manner towards the trenches for scattering other than the cleavage-assisting trenches.

As is clear from the above, the technique described in Japanese Laid-Open Patent Publication No. 2005-311308 may tend to be tightly limited both from the viewpoints of the degree of freedom of design and accuracy in the manufacturing processes.

Japanese Laid-Open Patent Publication No. 2005-311308 also describes that the stray light occurs over the entire range of the longitudinal direction of the optical waveguide. According to the publication, the stray light is intercepted by the end of the oscillator of the laser diode. The present inventors, however, found out from our research and development that excellence of flatness of crystal growth layer affects deformation and ripples in the far-field pattern. The present inventors compared the elements giving good far field patterns and those giving poor far field patterns, using an instrument capable of evaluating surface irregularity on the order of nanometer, such as atomic force microscope, and found out that the elements giving good far-field patterns tend to have small surface irregularities. The surface profile of the wafer may basically be ascribable to irregularity of the crystal growth layer. Since the optical waveguide structure of the semiconductor laser is fabricated in the crystal growth layer, so that the profile of the optical waveguide inevitably contains the irregularity. From our findings, it is supposed that the irregularity in the optical waveguide may yield something like a local emission source of the stray light, and may govern degradation in the far-field pattern.

A most fundamental solution for improvement in the far-field pattern is considered to improve the flatness of the crystal growth layer. It is, however, difficult to manufacture a flat layer on the nanometer level, over the entire range of the wafer in the process of crystal growth, as far as the nitride-base semiconductor materials are used.

Same problems reside in the techniques described in Japanese Laid-Open Patent Publications Nos. 2002-324947 and 2006-165407.

In short, it has been difficult to ensure a large process margin in the manufacturing, and to improve the profile of the far-field pattern at the same time.

SUMMARY

According to the present invention, there is provided a laser diode having a plurality of structures, each of which having a function of scattering, absorbing or reflecting stray light, on at least one of both sides of an optical waveguide, in a region along the optical waveguide, at least one of the structures is formed in each divided region obtained by equally dividing said region along the optical waveguide into three or more parts in the longitudinal direction of the optical waveguide.

As has been described in the above, sites of occurrence of the stray light are considered as rather local, so that a more exact understanding may be such that the local sources of stray light are distributed along the optical waveguide. As a technique of scattering, absorbing or reflecting the light emitted from the sources of stray light, the present inventors considered that an effective method may be such as disposing a structure having these functions also at around the center of the laser diode. Extremely speaking, it may be acceptable enough for the structure to reside only at around the sources of stray light. The major sources of stray light are, however, unintentionally formed in the process of manufacturing, so that the site of formation thereof cannot be preliminarily predicted. The system to be adopted herein is, therefore, such as disposing the structure in each of a plurality of sites distributed along the entire range of the optical waveguide.

According to the system, the stray light is scattered, absorbed or reflected in the close vicinity of the sources thereof, before propagating not so far in the laser diode. As a consequence, intensity of the stray light may be lowered to a sufficient degree. While a certain intensity of stray light may inevitably be output from the output end, the stray light contain components obtained after being scattered, absorbed or reflected a large number of times by the plurality of structure. Accordingly, also an effect of lowering the coherence of the stray light with the output light of laser may be expected. By virtue of reduction in both of the intensity and coherence of the stray light, the far-field pattern is suppressed from degrading in the profile.

Japanese Laid-Open Patent Publication No. 2005-311308 describes that a minimum distance between each trench and the optical waveguide is preferably 15 μm or shorter, and more preferably 10 μm or shorter. This is because, the effect of the trench will not be obtained unless the stray light emitted from regions in the close vicinity of the optical waveguide can be scattered at the end face of the element. In other words, since the structure described in this publication has the trenches formed only in the vicinity of the end face of the laser diode, so that it is necessary to dispose the trenches in the close vicinity of the optical waveguide, for the purpose of sufficiently reduce the intensity of stray light.

In contrast, according to the technique of the present invention, at least one structure is disposed in each divided region obtained by equally dividing the region along the optical waveguide into three or more parts in the longitudinal direction of the optical waveguide. In other words, the structures are evenly distributed along the entire range of the optical waveguide. The intensity and coherence of the stray light output from the output end of the laser diode are reduced by a total effect of such plurality of structures. Since the individual structures may be acceptable enough if they have a function of scattering, absorbing or reflecting the stray light, so that it is no more necessary to dispose the structures at a distance as close as almost adjacent to the optical waveguide. In other words, a sufficient effect of scattering, absorbing or reflecting the stray light may be obtained even if the structures are disposed away from the optical waveguide to some degree (20 μm or more, for example). Pattern layout of the structures may, therefore, be allowable under a large degree of freedom, and limitations on the manufacturing are not so stringent. As a consequence, an additional effect is that yield of the laser diode is almost not adversely affected.

According to the system of the present invention, the distance between the end face of the laser diode and the structure disposed most closely to the end face may be set widely, so far as cleavage of the wafer is not adversely affected. This is because the stray light may be scattered, absorbed or reflected over the entire region along the optical waveguide, so that almost comparable effect may be obtained without disposing the structures in the close vicinity of the end face of the laser diode. In view of suppressing the cleavage from being adversely affected, the structure is specifically formed only at a position more than 10 µm, preferably more than 20 µm, and more preferably more than 30 µm, away from the end face of the laser diode.

According to the present invention, there is provided also a method of manufacturing a laser diode which includes:

forming a plurality of structures, each of which having a function of scattering, absorbing or reflecting stray light, on at least one of both sides of an optical waveguide, in a region along the optical waveguide, wherein at least one of the structures is formed in each divided region obtained by equally dividing the region along said optical waveguide into three or more parts in the longitudinal direction of the optical waveguide.

According to the present invention, a large process margin in the manufacturing may be ensured, while improving the profile of the far-field pattern.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
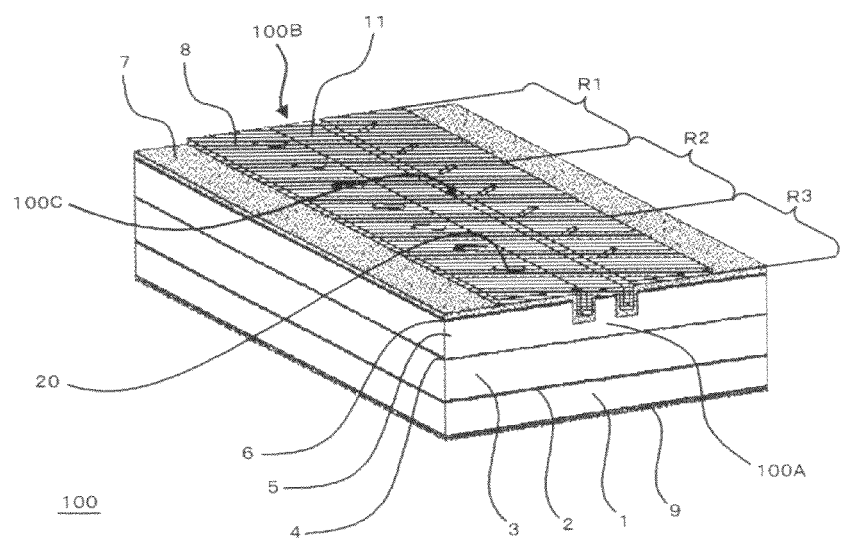
FIG. 1 is a perspective view illustrating a configuration of a laser diode according to a first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments will now be explained referring to the attached drawings. Note that any similar constituents will be given with the same reference numerals or symbols in all drawings, and explanations therefor will not be repeated.
[First Embodiment]

Figure 2:
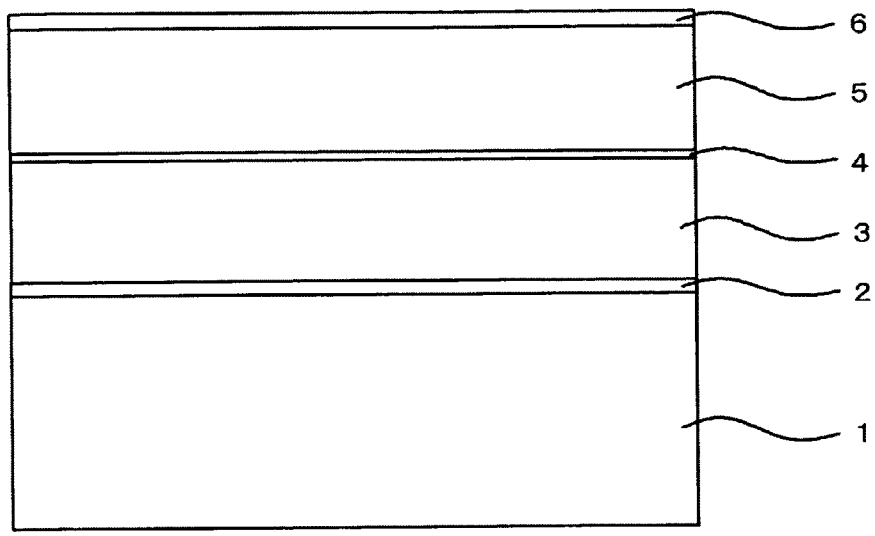
FIG. 2 is a drawing explaining a method of manufacturing a laser diode according to the first embodiment, in particular a sectional structure after crystal growth.
Figure 4:
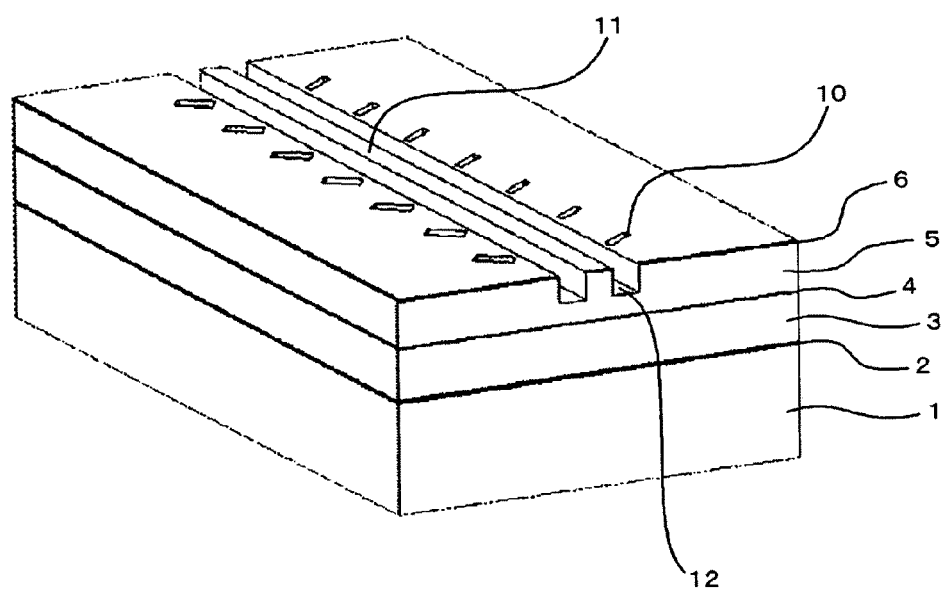
FIG. 4 is a perspective view explaining a method of manufacturing a laser diode according to the first embodiment, in particular a state after a mesa stripe which composes an optical waveguide was formed.
Figure 5:
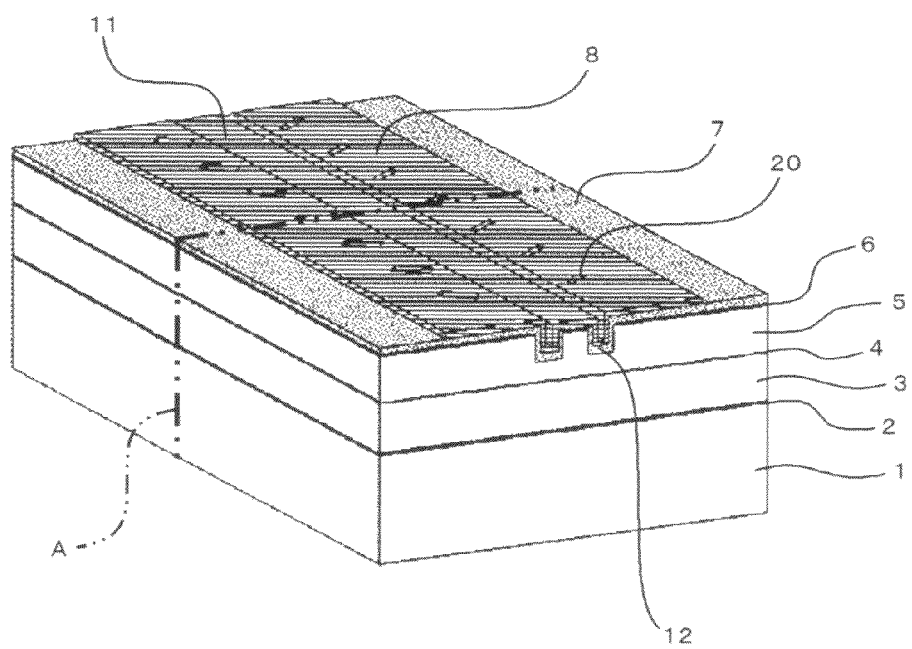
FIG. 5 is a perspective view explaining a method of manufacturing a laser diode according to the first embodiment, in particular a state after a dielectric film and a p-electrode were formed.
Figure 6:
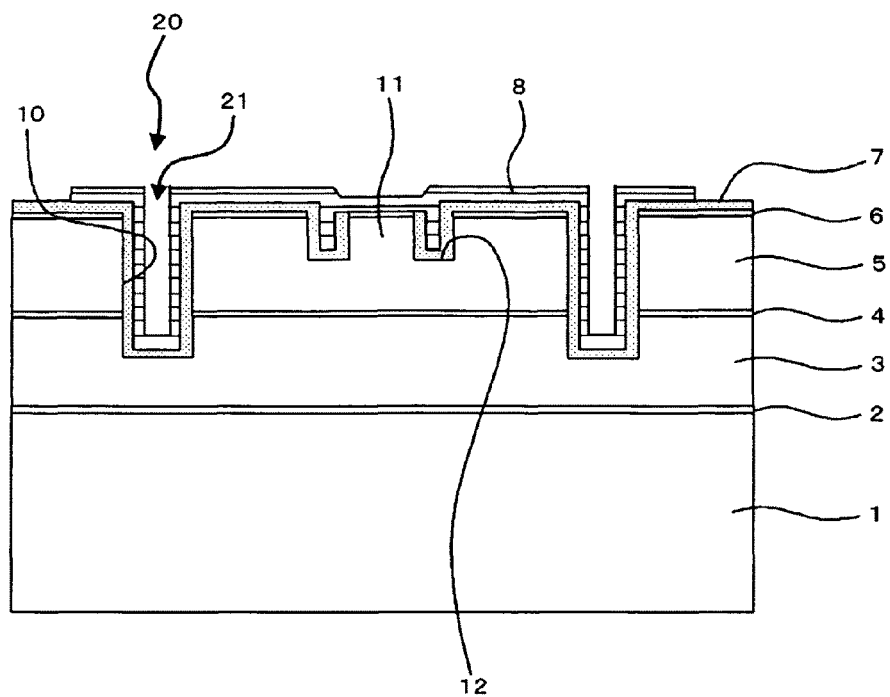
FIG. 6 is a sectional view of the state shown in FIG. 5.

FIG. 1 to FIG. 5 are drawings explaining a method of manufacturing a laser diode according to a first embodiment. Among these drawings, FIG. 2 is a sectional view, and FIG. 1 and FIG. 3 to FIG. 5 are perspective views, respectively. FIG. 1 also serves as a perspective view illustrating a structure of laser diode 100 according to the first embodiment. FIG. 6 is a sectional view taken along virtual line A in FIG. 5.

As illustrated in FIG. 1, the laser diode 100 has a plurality of structures 20, each of which having a function of scattering, absorbing or reflecting stray light, disposed on at least one of both sides of an optical waveguide 11, in a region along the optical waveguide 11. For more details, at least one of the structures 20 is formed in each divided region obtained by equally dividing the region along the optical waveguide 11 into three or more parts in the longitudinal direction of the optical waveguide 11 (trisected regions R1, R2, R3 in FIG. 1). A method of manufacturing the laser diode has a process of forming a plurality of structures 20, each of which having a function of scattering, absorbing or reflecting stray light, on at least one of both sides of the optical waveguide 11, in a region along the optical waveguide 11. For more detail, at least one structure 20 is formed in each divided region obtained by equally dividing the region along the optical waveguide 11 into three or more parts in the longitudinal direction of the optical waveguide 11 (trisected regions R1, R2, R3, for example, in FIG. 1). Details will be given below.

First, a configuration of the laser diode 100 of this embodiment will be explained, referring to FIG. 1.

This embodiment will explain an exemplary case where the laser diode 100 is a 405-nm-band laser diode using Group-III nitride semiconductors.

As illustrated in FIG. 1, the structure of the semiconductor portion of the laser diode 100 is configured by stacking, on an n-type GaN substrate 1, a low-temperature buffer layer 2, an n-type AlGaN cladding layer 3, an active layer 4 having a multiple quantum well structure, a p-type AlGaN cladding layer 5, and an p-type GaN contact layer 6 in this order. An n-electrode 9 is brought into contact with the n-type GaN substrate 1, and p-electrode 8 is brought into contact with the p-type GaN contact layer 6. The optical waveguide 11 exemplified herein has a ridge structure.

As illustrated in FIG. 1, the laser diode 100 has a plurality of structures (scattering/absorption/reflection structures) 20, each of which has a function of scattering, absorbing or reflecting stray light, disposed on at least one of both sides (each of both sides, herein) of a mesa stripe, which is the optical waveguide 11, in a region along the optical waveguide 11. More specifically, at least one of the structures 20 is formed in each divided region obtained by equally dividing the region along the optical waveguide 11 into three or more parts (typically in the trisected regions R1, R2, R3, in the example illustrated in FIG. 1) in the longitudinal direction of the optical waveguide.

By virtue of this configuration, the structures 20 may be disposed also at around a midpoint 100C between an output end 100A and a reflective end 100B, unlike the case where the structures 20 are disposed only in the vicinity of the output end 100A and the reflective end 100B.

The number of divided regions may arbitrary be selectable from three and lager integers, wherein a larger number more largely increases the distribution density of the structures 20 in the longitudinal direction of the optical waveguide 11, and thereby more largely enhances an effect of scattering, absorbing or reflecting the stray light. Note that the structures 20 are preferably disposed while keeping an appropriate distance in between, so as to avoid positional interference between the adjacent ones.

Each of the individual structures 20 may not always be disposed without stepping out from any one divided region, but any structure(s) 20 may lie across the boundary between two adjacent divided regions (divided regions R1 and R2, for example). A definition of the condition stating that "at least one structure 20 is disposed in each of the divided regions R1, R2, R3" will now be explained.

As for the structure 20 laid across the boundary between two adjacent divided regions, it will be defined herein that the structure 20 is assumed to be disposed in the divided region which contains a half or more portion of the structure 20 fallen thereon. It may be acceptable enough that the condition stating that "at least one structure 20 is disposed in each of the divided regions R1, R2, R3" is satisfied based on this assumption.

For precaution's sake, a mention will be given also to the case where just halves of the structure 20 evenly fall on two adjacent divided regions. In this case, the number of the structure 20 in each region is assumed as 0.5. The plurality of structures 20 may be acceptable enough so that at least one, as a total with other structure 20 (or a part thereof), of them reside in each of the divided regions R1, R2, R3.

The structures 20 are disposed periodically (at regular intervals, for example) over the entire region in the longitudinal direction of the optical waveguide, typically as illustrated in FIG. 1.

Each of the divided regions R1, R2, R3 preferably contain a plurality of structures 20 disposed therein. In this configuration, location of the plurality of structures 20 in each of the divided regions R1, R2, R3 may preferably be different from each other in the longitudinal direction of the optical waveguide 11. However, depending on the dimension of the structures 20, or for the case where the dimension is relatively small, the plurality of structures 20 may be disposed so as to overlap in the longitudinal direction of the optical waveguide 11, and so as to differ from each other in the direction perpendicular to the longitudinal direction.

Figure 3:
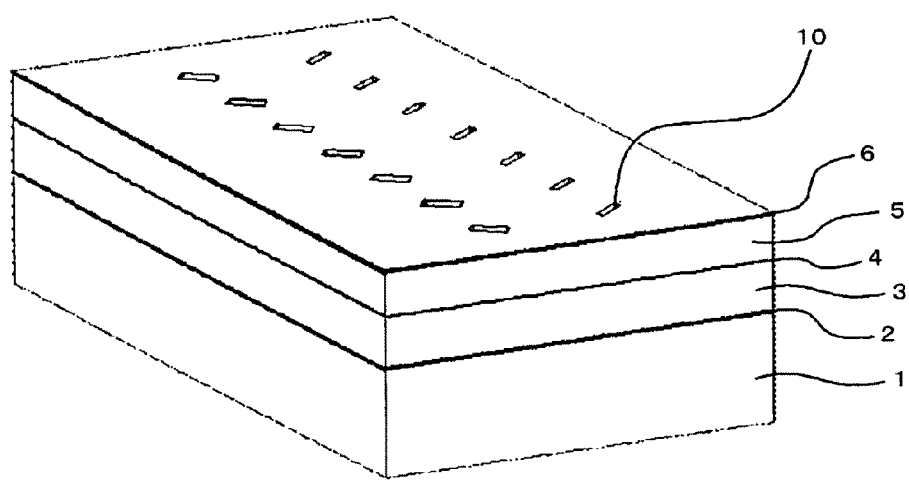
FIG. 3 is a perspective view explaining a method of manufacturing a laser diode according to the first embodiment, in particular a state after the recess was formed by etching.

Each of the structures 20 is configured to contain a recess 10 (FIG. 3, FIG. 4).

In this embodiment, the geometry of each recess 10 is typically given as a linear one extended 45° away from the optical waveguide 11. The plurality of recesses 10 are disposed so as to hold the optical waveguide 11 in between. Longish recess 10 may be disposed at long intervals, or shortish recesses 10 may be disposed at short intervals. As is clear from the above, large degrees of freedom in the design may be adoptable to design of the intervals and length of the recesses 10.

It is, however, anticipated that the portion of the recess 10 too far from the optical waveguide 11 is weakened in the effect of scattering, absorbing or reflecting the stray light. For this reason, the recess 10 is preferably limited in the length thereof to as long as several dozen micrometers or around, and instead increased in the number of disposition while narrowing the intervals therebetween.

As illustrated in FIG. 6, the recesses 10 are covered with a dielectric film 7 and a p-electrode 8. Of these, the p-electrode 8 is composed of a metal which scatters or reflects light at a wavelength of oscillation of the laser diode 100.

By the p-electrode 8, a specific material portion is configured. The structure 20 of this embodiment may, therefore, be said to have the specific material portion of a single film structure.

The portion composed of a metal in the specific material portion, or the p-electrode 8, also functions as an electrode of the laser diode 100. In this embodiment, the function of scattering and reflection of light is mainly contributed by reflection of light by a material composing the p-electrode 8.

In this embodiment, each recess 10 is not completely filled up, but has a hollow portion 21 formed therein more deeply behind the specific material portion.

Next, a method of manufacturing the laser diode 100 illustrated in FIG. 1 will be explained, referring to FIG. 1 to FIG. 5.

First, as illustrated in FIG. 2, the low-temperature buffer layer 2, the n-type AlGaN cladding layer 3, the active layer 4, the p-type AlGaN cladding layer 5, and the p-type GaN contact layer 6 are formed in this order on the n-type GaN substrate 1. The p-type and n-type AlGaN cladding layers 5, 3 may adopt a super-lattice structure composed of GaN layers and AlGaN layers.

Next, as illustrated in FIG. 3, the recesses 10 composing the structures 20 are formed by dry etching effected from the p-type GaN contact layer 6 side. Considering now the effect of the structures 20 to scatter, absorb or reflect the light, the depth of etching herein is determined so that the bottoms of the recesses 10 reach at least the active layer 4, and preferably to a midway of the thickness of the n-type AlGaN cladding layer 3 or deeper. The cases where the depth is large enough to reach the midway, or to further beyond, of the thickness of the n-type AlGaN cladding layer 3 include the case where the depth reaches midway of the thickness of the n-type AlGaN cladding layer 3, the case where the depth reaches the low-temperature buffer layer 2, and the case where the depth reaches the n-type GaN substrate 1.

In this embodiment, the interval of the recesses 10 is set regularly in the longitudinal direction of the optical waveguide 11 (formed later). The individual recesses 10 are disposed on both sides of the optical waveguide 11, typically line-symmetrically about the optical waveguide 11. For example, assuming now that the length of the recess 10 as 20 µm, and the periodicity of disposition of the individual recesses 10 as 40 µm, a laser diode having a length of oscillator of 800 µm will be simply calculated to have a total of approximately forty recesses 10 on both sides of the optical waveguide 11. The periodicity of disposition of the individual recesses 10 is preferably set so that the number of disposition of the recesses 10 totals twenty or more, on both sides of the optical waveguide 11. In short, the structures 20 are preferably provided to at least twenty sites.

Next, as illustrated in FIG. 4, a mesa stripe which composes the optical waveguide 11 is formed by a dry-etching technique. More specifically, two trenches 12 which extend between the output end 100A and the reflective end 100B of the laser diode 100 are formed so as to leave, in between, the mesa stripe which composes the optical waveguide 11. Since the optical waveguide 11 illustrated in FIG. 4 is of the ridge-type, the etching for forming the trenches 12 is terminated at a midway of the thickness of the p-type AlGaN cladding layer 5.

Next, the dielectric film 7 (see FIG. 5) for insulation is formed over the entire surface of the wafer, or over the p-type GaN contact layer 6. A portion of the dielectric film 7 on the optical waveguide 11 is then removed, to thereby form an opening which is used for forming the p-electrode 8. Thereafter, the p-electrode 8 according to a predetermined pattern is formed so as to cover the optical waveguide 11, typically by a lift-off technique (FIG. 5). As a consequence, the p-electrode 8 is brought into electrical contact with the p-type GaN contact layer 6, through the opening formed in the dielectric film 7.

FIG. 6 illustrates a sectional view of the recesses 10. A structure seen herein is such that the surface of the recesses 10 are covered with the dielectric film 7, and further with the p-electrode 8. The p-electrode 8 functions not only, and intrinsically, as an electrode, but also functions as a metal material for scattering the stray light by reflection.

Next, the back surface of the n-type GaN substrate 1 is polished to reduce the thickness of the n-type GaN substrate 1 typically to 100 μm or around, and an n-electrode 9 is then formed over the entire back surface of the wafer, which means over the entire back surface of the n-type GaN substrate 1 (FIG. 1).

Next, the wafer is cleaved into bars. The cleavage surfaces function as oscillator mirrors for enabling laser oscillation. The cleavage surfaces are generally coated, for the purpose of protection of the surfaces and adjustment of reflectivity. A single-layer or multi-layer structure making use of a dielectric material is often adopted to the coating. Lastly, by dividing each bar into elements, the laser diode 100 is completed.

The first embodiment described in the above raises the effects below.

Figure 12:
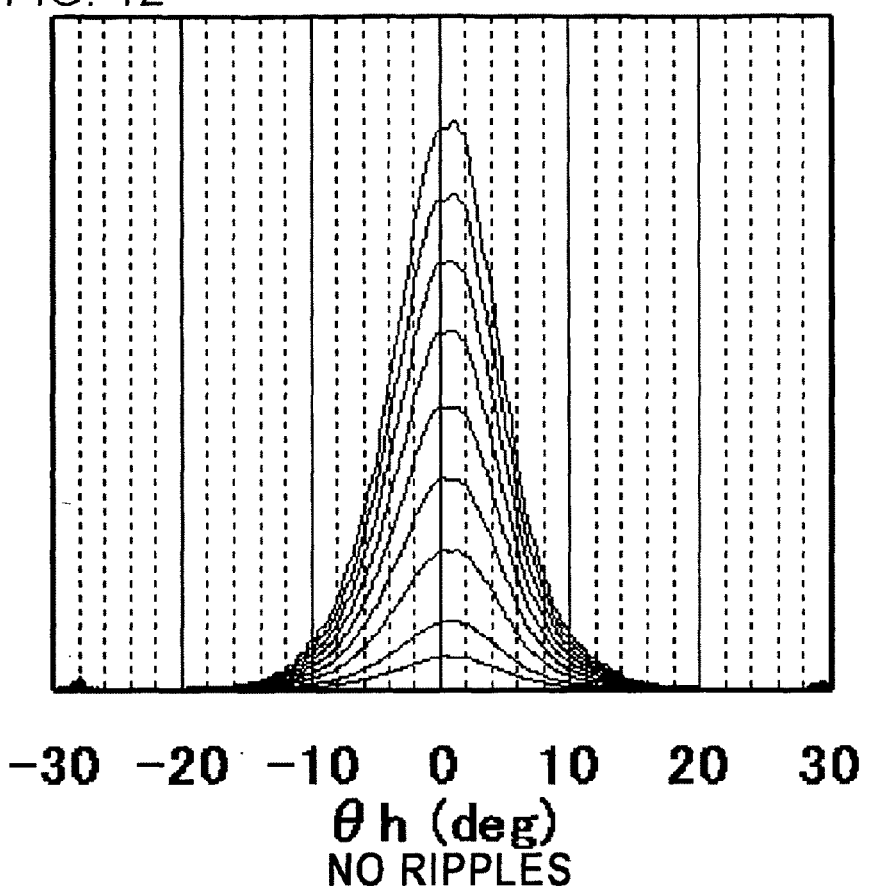
FIG. 12 is a drawing illustrating a profile of far-field pattern showing a good Gaussian profile.
Figure 13:
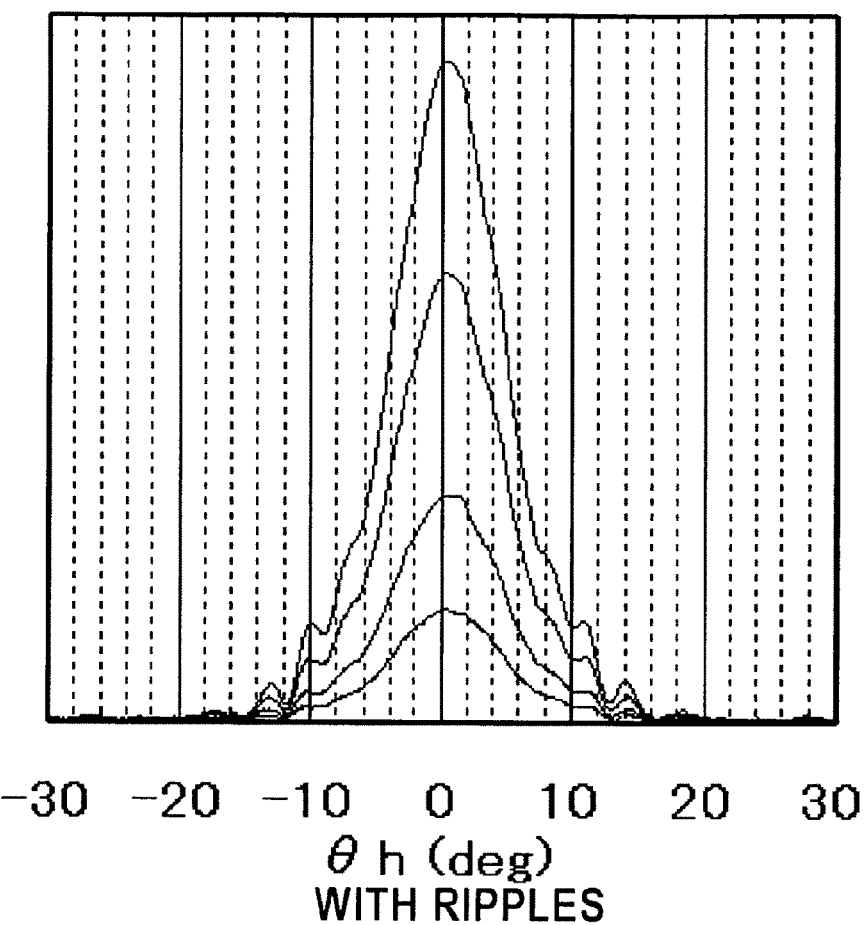
FIG. 13 is a drawing illustrating an exemplary profile of far-field pattern showing ripples and deformation.

First, the laser diode has a plurality of structures 20, each of which having a function of scattering, absorbing or reflecting stray light, disposed on each of both sides of the optical waveguide 11, in a region along the optical waveguide 11, at least one of the structures 20 is formed in each divided regions R1, R2 and R3 obtained by equally dividing said region along said optical waveguide into three parts in the longitudinal direction of the optical waveguide 11. Accordingly, the stray light may be scattered, absorbed or reflected in the close vicinity of the sources thereof, before propagating not so far in the laser diode 100. As a consequence, intensity of the stray light emitted from the output end 100A may be lowered to a sufficient degree, and the coherence of the stray light with the output light of the laser may be reduced. By virtue of reduction in both of the intensity and coherence of the stray light, the far-field pattern is suppressed from degrading in the profile. In other words, a good Gaussian profile of the far-field pattern as illustrated in FIG. 12 may be obtained, while suppressing ripples and deformation in the profile.

In addition, the intensity and the coherence of stray light emitted from the output end 100A of the laser diode 100 may be reduced, by a total effect of the plurality of structures 20 which are evenly distributed along the entire range of the optical waveguide 11. It is, therefore, no more necessary to dispose the structures 20 at a distance as close as almost adjacent to the optical waveguide 11. In other words, a sufficient effect of scattering, absorbing or reflecting the stray light may be obtained even if the structures 20 are disposed away from the optical waveguide 11 to some degree (20 μm or more, for example). Pattern layout of the structures may, therefore, be allowable under a large degree of freedom, and limitations on the manufacturing are not so stringent. As a consequence, an additional effect is that yield of the laser diode 100 is almost not adversely affected.

The distance between either of both end faces 100A, 100B of the laser diode 100 and the structure 20 closest thereto may be set widely, so far as cleavage of the wafer is not adversely affected. Since the structures 20 are distributed over the entire range of the region along the optical waveguide 11, almost comparable effect may be obtained without disposing the structures in the close vicinity of the end faces 100A, 100B of the laser diode 100. In view of suppressing the cleavage from being adversely affected, the structures 20 are specifically formed only at positions more than 10 μm, preferably more than 20 μm, and more preferably more than 30 μm, away from the end faces 100A, 100B.

These effects may further be enhanced by periodically disposing (in particular, at regular intervals) the structures 20 disposed over the entire region in the longitudinal direction of the optical waveguide 11.

For the purpose of enhancing the functions of reflection and scattering, it may be acceptable enough to increase the number of structures having a portion composed of a metal which scatters or reflects the stray light.

As has been described in the above, according to this embodiment, the profile of the far-field pattern may be improved, or the ripples and deformation may be suppressed, even if the distance between each of the structure 20 and the optical waveguide 11, and between each of the end faces 100A, 100B and the structures 20 closest thereto are set widely. As a consequence, the degree of freedom of disposition of the structures 20 may be increased, and a large process margin in the manufacturing may be ensured.

In short, a large process margin in the manufacturing may be ensured, while improving the profile of the far-field pattern.

[Second Embodiment]

The recesses 10 composing the structures 20, previously described in the first embodiment, were linear ones which extend obliquely with respect to the optical waveguide 11. Other exemplary geometries and disposition (arrangement) will be explained in a second embodiment. Note that any aspects in the second embodiment, other than the geometry of the recesses 10, are same as those described in the first embodiment.

FIG. 7 to FIG. 10 respectively show exemplary geometries of the recesses 10 different from those in the first embodiment. FIG. 7 to FIG. 10 illustrate the states, in the same step of manufacturing as illustrated in FIG. 4, viewed from the top (from the p-type GaN contact layer 6 side).

Figure 7:
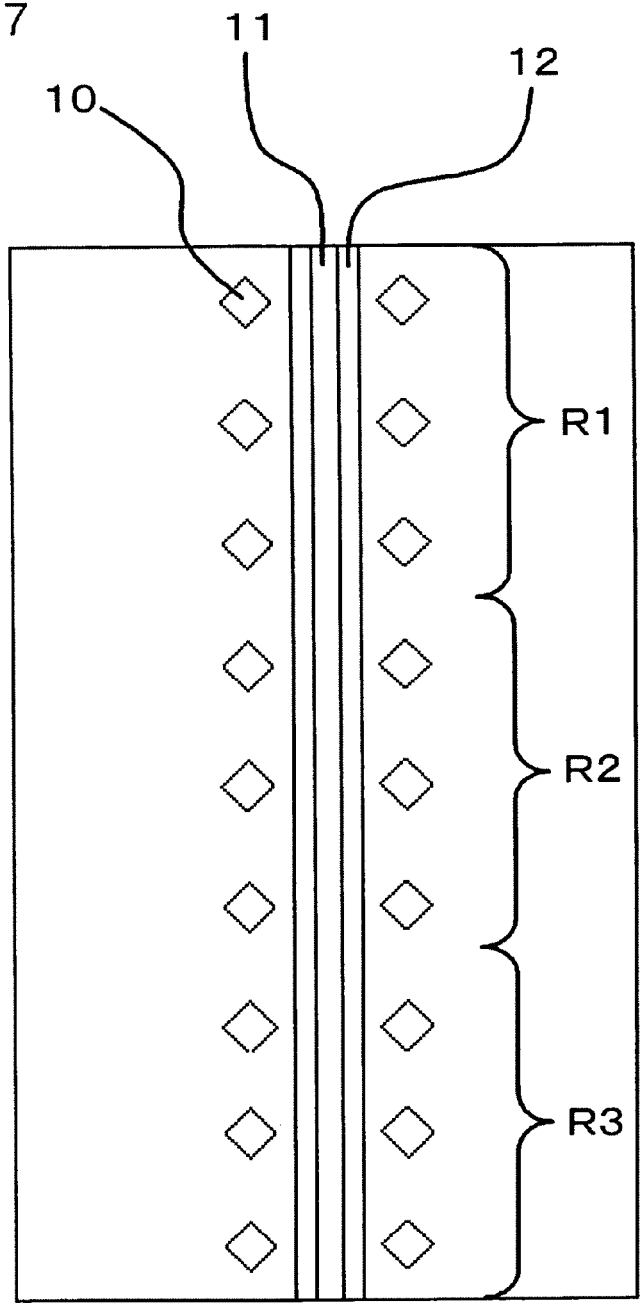
FIG. 7 to FIG. 10 are plan views illustrating exemplary geometries of a recess explained in a second embodiment.

Typically as illustrated in FIG. 7, the recesses 10 may be formed into rhombus. Also other geometries, such as rectangle, other quadrangles, polygons other than quadrangles, and circle may be adoptable.

Even geometries more complicated than those illustrated in FIG. 7 may be adoptable. For example, L-shaped recesses 10 illustrated in FIG. 8 may be exemplified.

Figure 8:
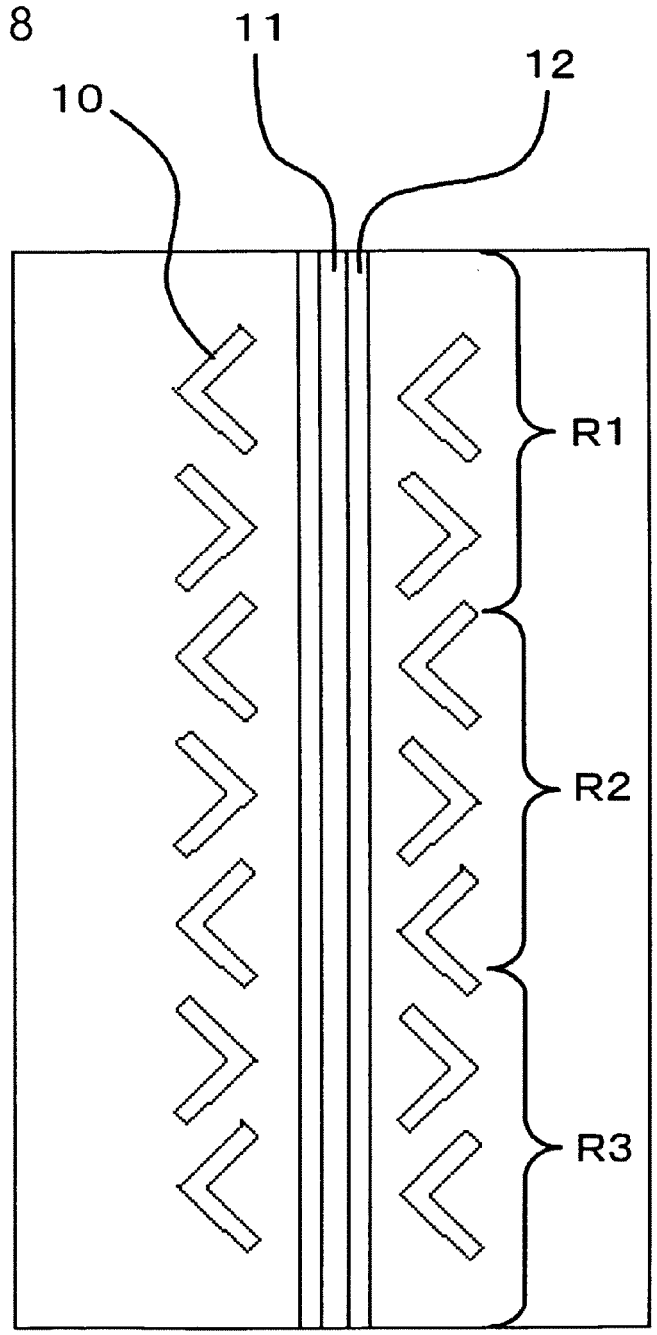

As for arrangement of the recesses 10, as illustrated in FIG. 8, orientation of the individual recesses 10 may sequentially (or randomly) be altered in the longitudinal direction of the optical waveguide 11. In the example illustrated in FIG. 8, the individual recesses 10 are disposed in an alternately counter-oriented manner, in the longitudinal direction of the optical waveguide 11. More specifically, the L-shaped recesses 10 are disposed so as to alternately invert the direction the opened sides thereof.

Figure 9:
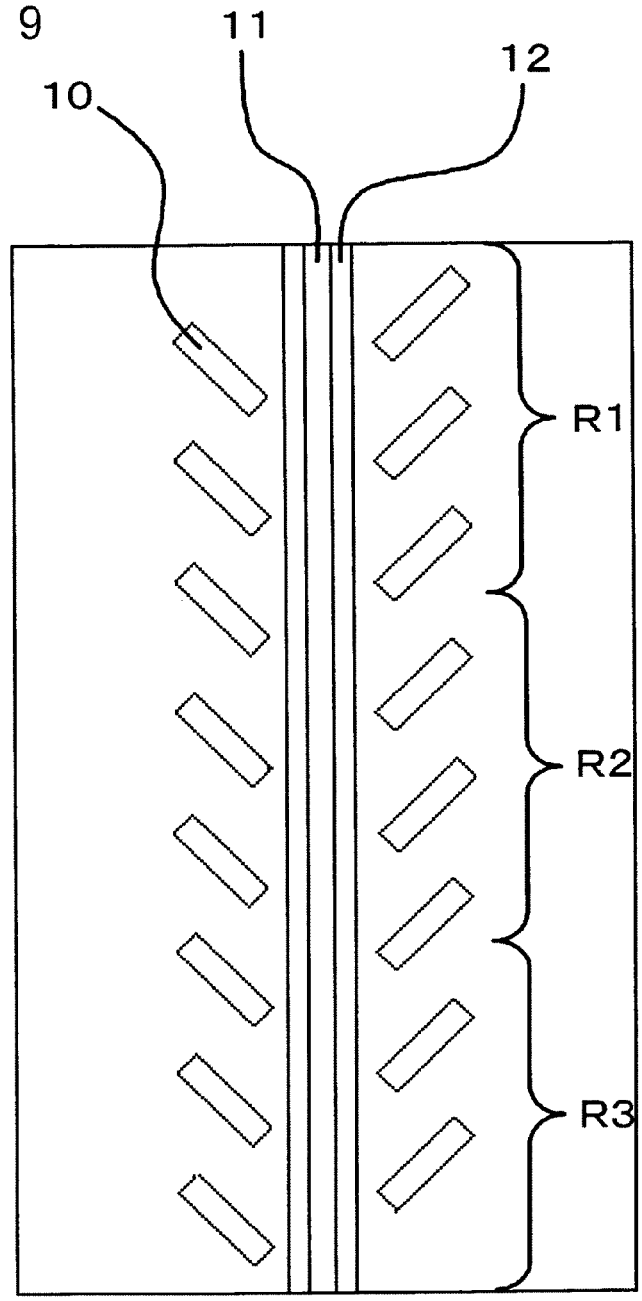

Although the recesses 10 explained in the first embodiment were typically disposed on both sides of the optical waveguide 11, and line-symmetrically about the optical waveguide 11, the recesses 10 may be disposed, typically as illustrated in FIG. 9, alternately on both sides of the optical waveguide 11, or in a staggered manner.

Figure 10:
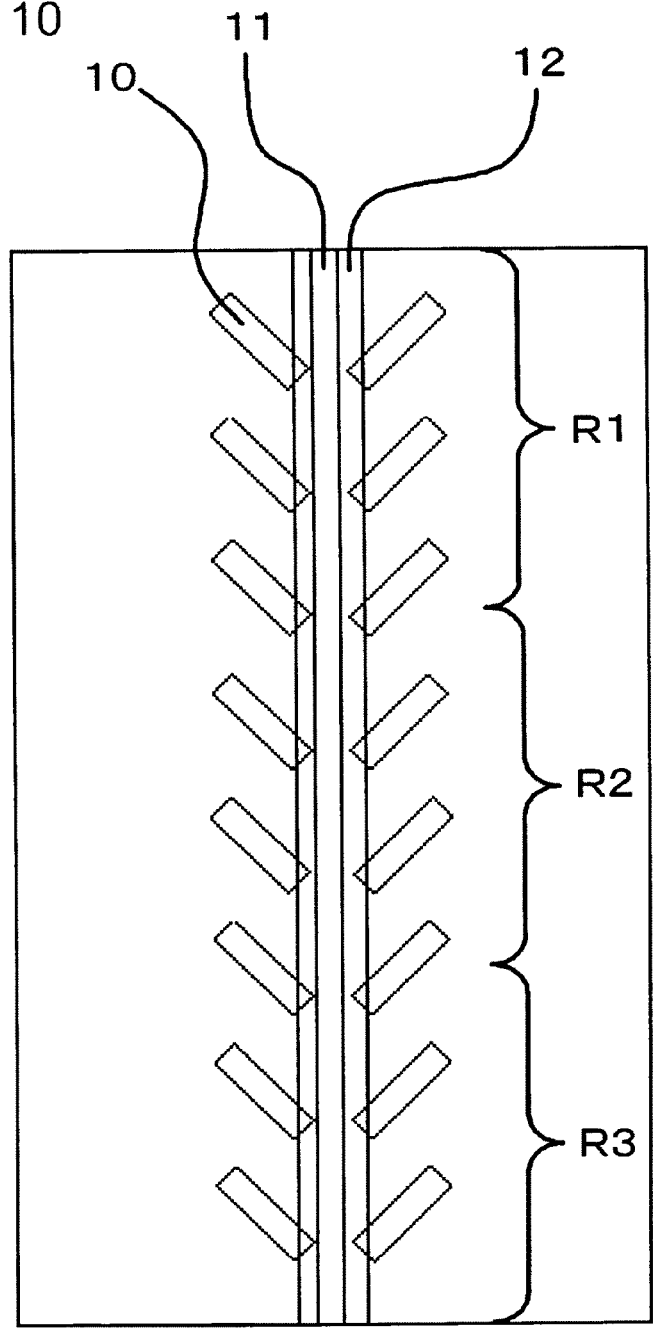

Still alternatively, as illustrated in FIG. 10, a part of, or the entire portions of each recess 10 may fall on each of the trenches 12 formed by etching on both side of the optical waveguide 11.

Also by the second embodiment, effects similar to those in the first embodiment may be obtained.

It is not always necessary to dispose the recesses 10 periodically in the longitudinal direction of the waveguide 11 as explained in the individual embodiments, wherein an irregular arrangement is also acceptable. What is important is to dispose a large number of recesses 10 over the entire range in the longitudinal direction of the optical waveguide 11.

Although the cases explained in the individual embodiments related to those where a plurality of recesses 10, all of which having the same geometry, were disposed, another acceptable case may be such as disposing the recesses 10 having a plurality of geometries in combination.

In the individual embodiments described in the above, the surface of the recesses 10 was covered not only with the dielectric film 7, but also with a metal material (the electrode (the p-electrode 8), for example). In this configuration, the effect of scattering and reflecting light is mainly ascribable to reflection of light on the electrode material. The present invention is, however, not limited to these examples, and allows the structures 20 configured simply by the recesses 10. In other words, the recesses 10 may be configured without being covered with the dielectric film 7 nor with the metal material. For example, a structure having the recesses 10 not covered by the dielectric film 7 nor with the electrode (p-electrode 8) may be obtained, by forming the dielectric film 7 and the electrode (p-electrode 8), after a mask is formed over the recesses 10. In this configuration, total reflection may be obtained at the boundary between the air in the recesses 10 and the peripherals, because the semiconductor has a larger refractive index than the air has. Scattering of the stray light is mainly ascribable to the effect of total reflection. For the purpose of facilitating the total reflection, the pattern geometry and angle of the recesses 10 are preferably selected so as to ensure a sufficiently large angle between the side walls of the recesses 10 and the direction in which the optical waveguide 11 extends.

Alternatively, the recess 10 may be covered with only a single film of dielectric film 7, in place of being covered with the dielectric film 7 and the metal material (electrode (the p-electrode 8), for example). In the structure, the effect of scattering light is mainly ascribable to reflection caused by difference in the refractive index between semiconductor or dielectric film 7, and the air in the hollow portions 21. In general, the refractive index decreases in the order from semiconductor, dielectric and air, wherein semiconductor has the largest index, dielectric follows, and the air has the smallest index. Also in this case, the stray light causes total reflection on the side walls of the recesses, if the incident angle of stray light is large enough. The dielectric film 7 may be configured by using a semiconductor material in place of a dielectric material, or may have a multi-layered structure composed of a plurality of these materials (multi-layered film structure). In particular, many of semiconductor materials show intense absorption in the 405-nm band, from which an effect of absorption of light is obtainable. The semiconductor materials may be exemplified by silicon.

As another example of the specific material portion, the electrode may be configured by using a plurality of metal layers (multi-layered film structure), and thus-configured electrode may be adoptable as the specific material portion which scatters or reflects light at a wavelength of oscillation of the laser diode 100.

As has been described in the above, the specific material portion may be configured to have at least either of a portion which absorbs light at a wavelength of oscillation of the laser diode 100, and a portion composed of a metal which scatters or reflects light at the wavelength of oscillation. The material which absorbs the light at the wavelength of oscillation of the laser diode 100 may be selectable from semiconductor materials or dielectric materials. The specific material portion may have a single-layered film structure or a multi-layered film structure. In particular for the case where the structure 20 contains the recesses 10, the recesses 10 may be covered with the single-layered or multi-layered film structure as the specific material portion.

Figure 11:
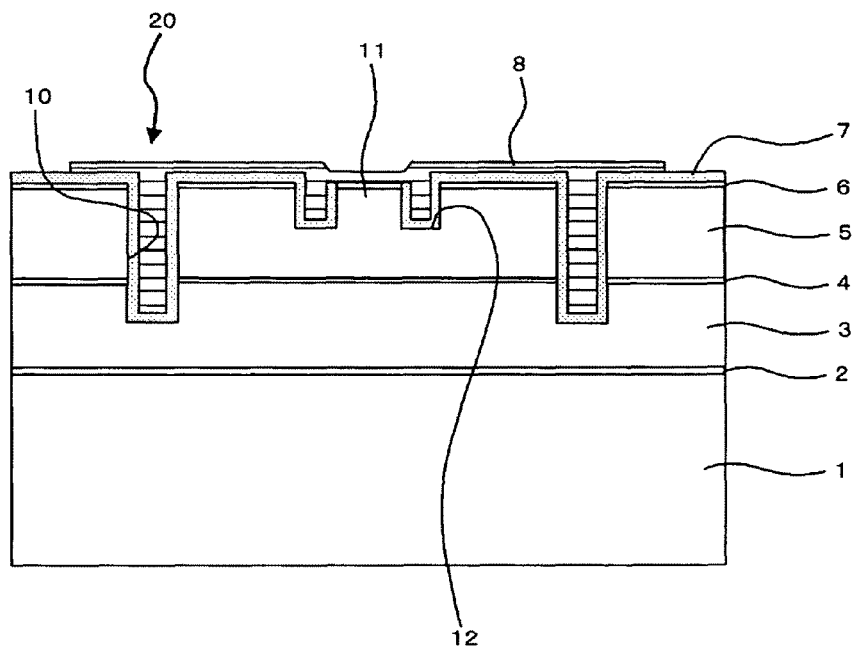
FIG. 11 is a sectional view illustrating a modified example of a scattering/absorption/reflection structure.

The embodiments in the above have explained the case where the hollow portions 21 reside inside the recesses 10 of the structures 20, meanwhile the recesses 10 may completely be filled up so as to have no hollow portions 21 remained therein. For example, exemplified herein is a configuration illustrated in FIG. 11, in which the recesses 10 are completely filled up by forming therein the dielectric film 7 and the p-electrode 8. Also in this case, the recesses 10 may be completely be filled up only by the dielectric material, or only by the semiconductor material. Still alternatively, the recesses 10 may completely be filled up by a multi-layered film structure having these material films arbitrarily combined therein.

The explanation in the above dealt with only the case where the structures 20 are configured to have the recesses 10, meanwhile the structures may be configured without using the recesses 10, but typically by burying the specific material portion, which is similar to that described in the above, in the laser diode 100 (at a position not exposed to the external).

In the configuration exemplified in the embodiments, the optical waveguide had a ridge structure, and the n-electrode 9 was formed on the back surface of the substrate (n-type GaN substrate 1). The present invention may, however, be adoptable irrespective of types of the optical waveguide 11, including those based on the ridge configuration and buried configuration. The n-electrode may alternatively be provided to the top surface of the laser diode. For the case where an insulating substrate, such as sapphire substrate, is used, a general configuration is such as providing the n-electrode to the top surface of the laser diode.

It is apparent that the present invention is not limited to the above embodiments, that may be modified and changed without departing from the scope and spirit of the invention.

What is claimed is:

1. A laser diode, comprising:
a plurality of structures, each of which having a function of scattering, absorbing or reflecting stray light, disposed on at least one of both sides of an optical waveguide, in a region along said optical waveguide, each of the plurality of structures comprising a recess; and
a specific material portion disposed over the optical waveguide and extending into the plurality of structures, the specific material portion filling an entirety of the structures,
wherein at least one of said structures is formed in each divided region obtained by equally dividing said region along said optical waveguide into three or more parts in the longitudinal direction of said optical waveguide, said three or more parts comprising an output end, a midpoint, and a reflective end of the laser diode,
wherein said recess is positioned remote to said optical waveguide,
wherein, in a side view, said recess is arranged in a position which overlaps with said optical waveguide,
wherein a semiconductor portion of the laser diode comprises:
a first cladding layer;
an active layer stacked on said first cladding layer;
a second cladding layer stacked on said active layer;
a contact layer stacked on said second cladding layer; and
a trench disposed on both sides of said optical waveguide, in a region along said optical waveguide, in said both sides of said optical waveguide, said trench extending to said contact layer and said second cladding layer, and
wherein a depth of said recess reaches at least said active layer from an upper surface of said contact layer.

2. The laser diode according to claim 1, wherein each of said divided regions has a plurality of said structures disposed therein.

3. The laser diode according to claim 2, wherein locations of said plurality of structures in the individual divided regions are different from each other in the longitudinal direction of the optical waveguide.

4. The laser diode according to claim 1, wherein said structures are periodically disposed over an entirety of the region in the longitudinal direction of said optical waveguide.

5. The laser diode according to claim 1, wherein said structures are disposed at regular intervals over an entirety of the region in the longitudinal direction of said optical waveguide.

6. The laser diode according to claim 1, wherein said specific material portion includes at least one of a portion comprising a material which absorbs light at a wavelength of oscillation of said laser diode, and a portion comprising a metal which scatters or reflects said light at the wavelength of oscillation.

7. The laser diode according to claim 6, wherein said material which absorbs light at the wavelength of oscillation comprises a semiconductor material or a dielectric material.

8. The laser diode according to claim 6, wherein each of said structures has a single film structure or a multi-layered film structure as said specific material portion.

9. The laser diode according to claim 6, wherein said specific material portion has a portion comprising said metal, and said portion functions also as an electrode of said laser diode.

10. The laser diode according to claim 1, wherein said structures are disposed in at least 20 positions.

11. The laser diode according to claim 1, wherein said structures are disposed on each of both sides of said optical waveguide.

12. The laser diode according to claim 1, wherein the optical waveguide extends along an entire length of the laser diode.

13. The laser diode according to claim 12, wherein the plurality of structures is evenly distributed along an entire length of the optical waveguide.

14. The laser diode according to claim 1, wherein the plurality of structures is disposed on both sides of the optical waveguide, line-symmetrically about the optical waveguide.

15. A laser diode, comprising:
an optical waveguide extending from a reflective end of the laser diode to an output end of the laser diode;
a plurality of structures, having a function of scattering, absorbing or reflecting stray light, disposed along said optical waveguide, each of the plurality of structures comprising a recess; and
a specific material portion disposed over the optical waveguide and extending into the plurality of structures, the specific material portion filling an entirety of the structures,
wherein at least one of said structures is formed in a region proximate the output end of the laser diode, in a region proximate a midpoint of the laser diode, and in a region proximate the reflective end of the laser diode,
wherein said recess is positioned remote to said optical waveguide,
wherein, in a side view, said recess is arranged in a position which overlaps with said optical waveguide,
wherein a semiconductor portion of the laser diode comprises:
a first cladding layer;
an active layer stacked on the said cladding layer;
a second cladding layer stacked on said active layer;
a contact layer stacked on said second cladding layer; and
a trench disposed on both sides of said optical waveguide, in a region along said optical waveguide, in said both sides of said optical waveguide, said trench extending to said contact layer and said second cladding layer, and
wherein a depth of said recess reaches at least said active layer from an upper surface of said contact layer.

16. The laser diode according to claim 1, wherein said specific material portion comprises a metal portion which scatters or reflects said light at a wavelength of oscillation, said metal portion functioning also as an electrode of said laser diode.

17. The laser diode according to claim 16, further comprising a dielectric film disposed between a surface of the optical waveguide and said specific material portion, said dielectric film extending into said recess.

18. The laser diode according to claim 15,
wherein said recess is depressed downward such that a dent direction of the recess is in a stacking direction of the first cladding layer, the active layer, and the second cladding layer.

19. The laser diode according to claim 15, wherein said recess comprises a plurality of recesses separated from each other.

20. The laser diode according to claim 1,
wherein the recess is depressed downward such that a dent direction of the recess is in a stacking direction of the first cladding layer, the active layer, and the second cladding layer.

21. The laser diode according to claim 1, wherein said recess comprises a plurality of recesses separated from each other.

* * * * *